(12) United States Patent
Pan

(10) Patent No.: US 7,227,402 B2
(45) Date of Patent: Jun. 5, 2007

(54) SYSTEM AND METHOD FOR CONTROLLING INPUT BUFFER BIASING CURRENT

(75) Inventor: Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/925,234

(22) Filed: Aug. 23, 2004

(65) Prior Publication Data

US 2006/0038591 A1 Feb. 23, 2006

(51) Int. Cl.
G11C 5/14 (2006.01)
(52) U.S. Cl. .................. 327/530; 327/538; 327/108; 327/112; 323/312; 323/315
(58) Field of Classification Search ............ 327/530, 327/538, 108, 112
See application file for complete search history.

(56) References Cited

U.S. PATENT DOCUMENTS

| | | | | |
|---|---|---|---|---|
| 4,937,476 A | | 6/1990 | Bazes | 326/71 |
| 5,220,206 A | * | 6/1993 | Tsang et al. | 327/544 |
| 5,257,226 A | | 10/1993 | McClure | 365/189.09 |
| 5,278,467 A | | 1/1994 | Nedwek | 327/52 |
| 5,448,182 A | * | 9/1995 | Countryman et al. | 326/30 |
| 5,493,243 A | * | 2/1996 | Ghoshal | 327/158 |
| 5,917,850 A | * | 6/1999 | Fujita et al. | 375/150 |
| 5,973,549 A | | 10/1999 | Yuh | 327/541 |
| 6,054,894 A | * | 4/2000 | Wright et al. | 330/149 |
| 6,167,245 A | * | 12/2000 | Welland et al. | 455/260 |
| 6,222,395 B1 | | 4/2001 | Bertin et al. | 327/77 |
| 6,307,424 B1 | * | 10/2001 | Lee | 327/530 |
| 6,317,066 B1 | * | 11/2001 | Chiang | 341/144 |
| 6,335,891 B1 | | 1/2002 | Wilkins | 365/225.7 |
| 6,392,453 B1 | | 5/2002 | Morzano et al. | 327/108 |
| 6,452,429 B1 | | 9/2002 | Lim | 327/108 |
| 6,459,320 B2 | * | 10/2002 | Lee | 327/310 |
| 6,566,851 B1 | * | 5/2003 | Schuelke et al. | 323/315 |
| 6,600,483 B1 | | 7/2003 | Akita et al. | 345/204 |
| 6,608,472 B1 | * | 8/2003 | Kutz et al. | 323/313 |
| 6,741,846 B1 | * | 5/2004 | Welland et al. | 455/260 |
| 6,937,075 B2 | * | 8/2005 | Lim et al. | 327/157 |
| 2003/0067328 A1 | | 4/2003 | Wright et al. | 327/108 |
| 2003/0222705 A1 | * | 12/2003 | Tamura et al. | 327/538 |

* cited by examiner

*Primary Examiner*—Tuan T. Lam
*Assistant Examiner*—Hiep Nguyen
(74) *Attorney, Agent, or Firm*—TraskBritt

(57) ABSTRACT

A system and method for controlling input buffer biasing current include an input buffer circuit with an input current detector circuit configured to generate a plurality of discrete biasing control signals. At least one input buffer is configured to adjust the biasing current in response to the plurality of discrete biasing control signals. The plurality of discrete biasing control signals is generated in response to variations in biasing current of the at least one input buffer. The method compares a representative bias current indicator from a replica of an input buffer with a reference current to determine variations in biasing current of at least one input buffer. A plurality of discrete biasing control signals is generated indicating a configuration of a biasing control for the at least one input buffer. The at least one input buffer is biased according to the plurality of discrete biasing control signals.

30 Claims, 10 Drawing Sheets

SYSTEM AND METHOD FOR CONTROLLING INPUT BUFFER BIASING CURRENT

BACKGROUND OF THE INVENTION

1. Field of the Invention

This invention relates in general to integrated circuits and, more particularly, to devices and methods for controlling biasing current of input buffers of integrated circuits over variations, such as voltage, temperature and process variations.

2. State of the Art

The first element of any integrated circuit data path is a data input buffer. Input buffers may be implemented in semiconductor devices using, for example, CMOS transistors which may be arranged generally in the form of cascaded inverters. Such transistors are sized to carefully provide high speed operations as well as to provide specific transition points resulting in the assignment of an input signal to either of a high or low logic output state. Designing an input buffer to meet various specifications generally requires a flexible design due to the variations in temperature, supply voltage and process variations. Because of such variations, the performance of an input buffer is often not determined by simulation but rather by the fabrication of an actual design.

Various input buffer designs for buffering an input signal prior to coupling that signal to other circuitry are well known in the prior art. Because of variations in, for example, power supply signal levels, a basic inverter-based input buffer may not meet specific design goals, an example of which is the centering of a trip-point or signal level at which an input signal will be designated as being of one of two logic levels. To specify a specific trip-point at which an input buffer characterizes an input signal as being of one of two signal levels, differential input buffers have been designed. FIG. 1 illustrates a simplified CMOS differential amplifier configured as an input buffer 10. Such a configuration with an inverter output generates a valid CMOS logic level. Common-mode noise on the differential amplifier inputs is, ideally, rejected while amplifying the difference between the input signal and the reference signal. The differential amplifier input common-mode range, for example a few hundred mV, sets a minimum input signal amplitude centered around $V_{REF}$ which causes the output signal, OUT, to change states. The speed of the configuration of input buffer 10 of FIG. 1 is limited by the differential amplifier biasing current. Generally, a large current increases the input receiver speed and decreases the amplifier gain, thereby reducing the differential amplifier's input common mode range. One shortcoming of the input buffer 10 is that it requires an additional external biasing circuit to generate the bias signal.

FIG. 2 illustrates an input buffer 20 arranged in a self-biasing configuration which does not need an additional circuit for generating a bias signal. Input buffer 20 is configured by joining a p-channel differential amplifier and an n-channel differential amplifier at the active load terminals. In input buffer 20, an adjustable biasing configuration is arranged which is potentially very efficient and fast at switching the input signal level to a valid output logic level. Self-biasing buffers and amplifiers are frequently utilized because of their simple architecture and fast switching speeds. However, as previously stated, the biasing current is very sensitive to power supply voltage, temperature and process variations. In one example (see FIG. 3), the biasing current may vary from 88 µA to 304 µA for each input buffer. For a device, such as a memory device which includes 16 or more input buffers, the total biasing current may vary widely, for example from between 3.5 mA to 12.5 mA, or over 300%, in the case of a DDR2 DRAM using 43 input buffers.

As an illustrative example, FIG. 3 illustrates a plot of input buffer biasing current variations over varying conditions for a conventional DDR2 (dual data rate) input buffer for a DRAM. FIG. 3 illustrates a graph 30 depicting variations in supply voltage with plots 32 and 34 and the plots are also a function of process and temperature variations 36–50. Each of the variations 36–50 illustrates process variations "FST" where "F" and "S" represent the speed nature (e.g., "F" for fast and "S" for slow) for the respective n-channel and p-channel devices when subjected to corresponding process variations. "T" represents temperature variations of the input buffer. As illustrated, the input buffer biasing current varies dramatically between process variations which include slow n-channel and p-channel devices at 110° C. with low supply voltage and variations which include fast n-channel and p-channel devices at −40° C. with high supply voltage. Therefore, there is a need for an improved input buffer circuit biasing arrangement which minimizes excessive biasing current over the various variation conditions.

BRIEF SUMMARY OF THE INVENTION

The present invention is directed to a system and method for controlling input buffer biasing current. In one embodiment of the present invention, an input buffer circuit includes an input current detector circuit configured to generate a plurality of discrete biasing control signals. The input buffer circuit also includes at least one input buffer configured to adjust the biasing current in response to the plurality of discrete biasing control signals. The plurality of discrete biasing control signal is generated in response to variations in biasing current of the at least one input buffer.

In another embodiment of the present invention, an integrated circuit device includes an integrated circuit and at least one input buffer circuit coupled to the integrated circuit. The input buffer circuit includes an input current detector circuit configured to generate a plurality of discrete biasing control signals and at least one input buffer configured to adjust the biasing current in response to the plurality of discrete biasing control signals. The plurality of discrete biasing control signals is generated in response to variations in biasing current of the at least one input buffer.

In a further embodiment of the present invention, an electronic system is provided, which includes an input device, an output device, an integrated circuit device and a processor device coupled to the input, output, and integrated circuit devices. At least one of the devices includes an input buffer circuit comprised of an input current detector circuit configured to generate a plurality of discrete biasing control signals and at least one input buffer configured to adjust the biasing current in response to the plurality of discrete biasing control signals. The plurality of discrete biasing control signals is generated in response to variations in biasing current of the at least one input buffer.

In a yet further embodiment of the present invention, a semiconductor wafer is provided which includes an integrated circuit device fabricated on its surface. The integrated circuit device includes an integrated circuit and at least one input buffer circuit coupled to the integrated circuit. The at least one input buffer circuit includes an input current detector circuit configured to generate a plurality of discrete biasing control signals and at least one input buffer. The input buffer is configured to adjust the biasing current in response to the plurality of discrete biasing control signals. The plurality of discrete biasing control signals is generated in response to variations in biasing current of the at least one input buffer.

In a yet additional embodiment of the present invention, a method for altering biasing current in an input buffer circuit is provided. The method compares a representative bias current indicator from a replica of an input buffer with a reference current to determine variations in biasing current of at least one input buffer. A plurality of discrete biasing control signals is generated indicating a configuration of a biasing control for the at least one input buffer. The at least one input buffer is biased according to the plurality of discrete biasing control signals.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1:
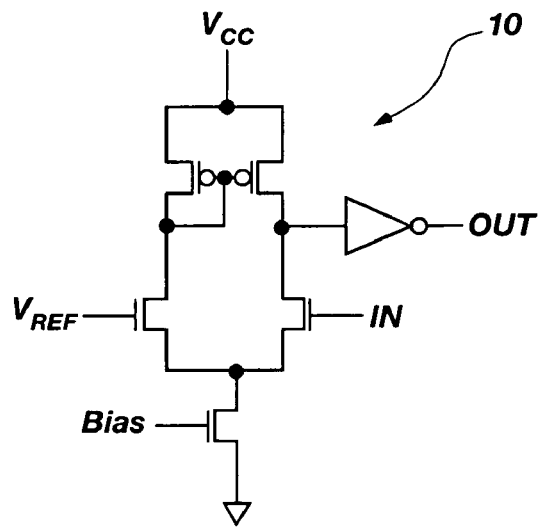
FIG. 1 is a circuit diagram of an input buffer, in accordance with the prior art.
Figure 2:
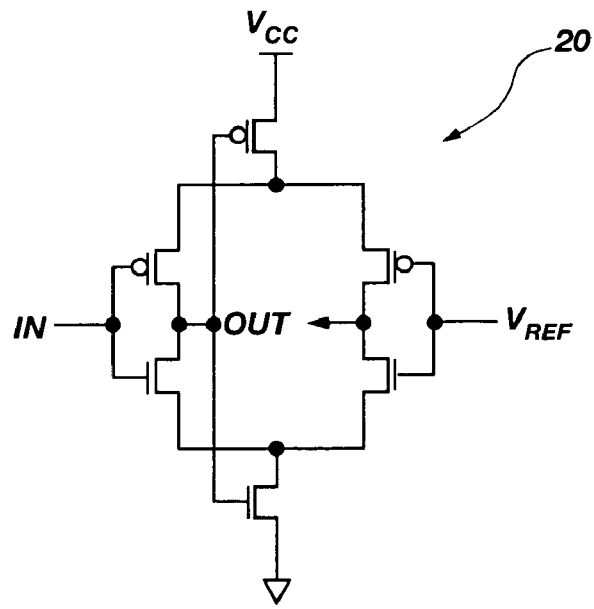
FIG. 2 is a circuit diagram of a self-biasing input buffer, in accordance with the prior art.
Figure 3:
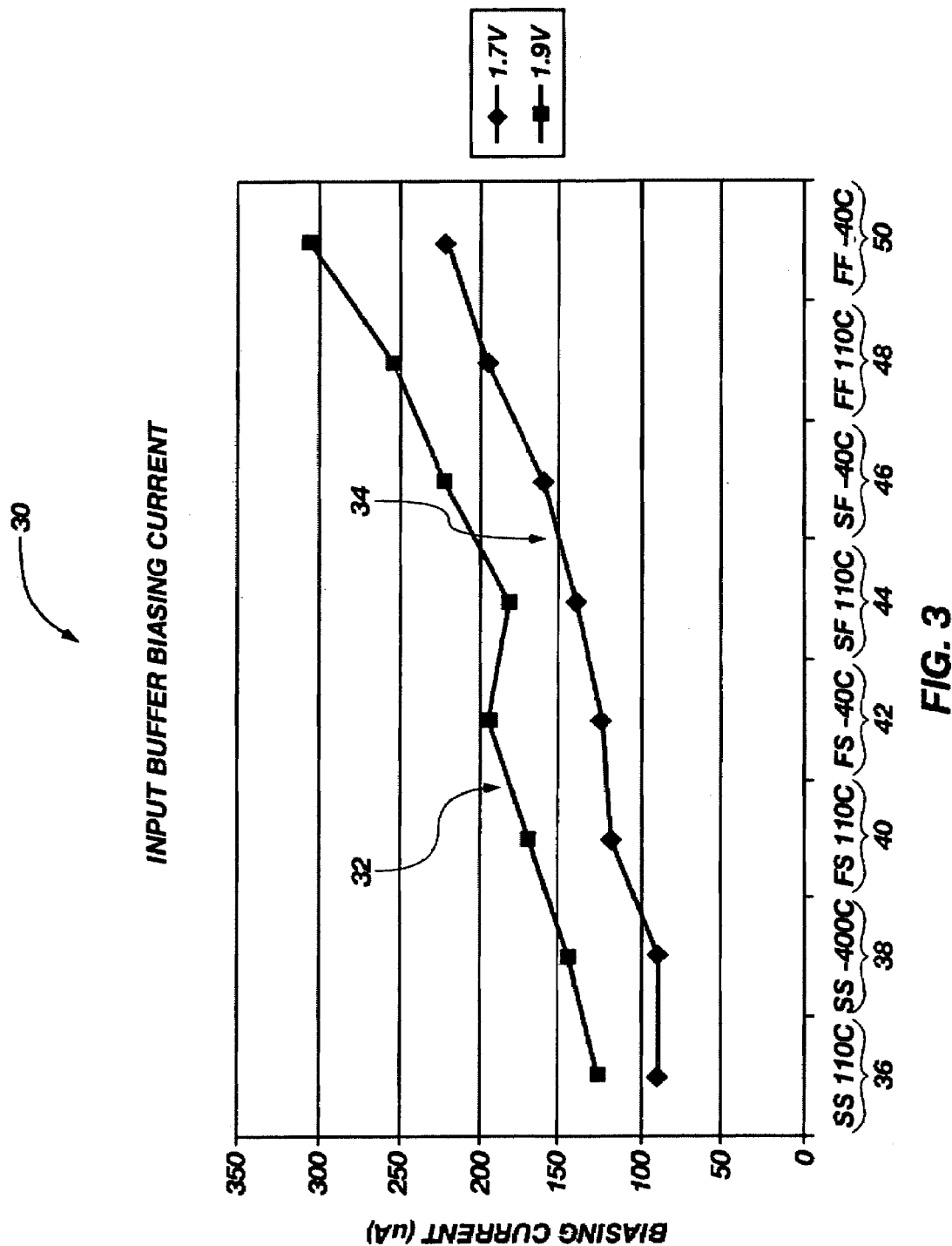
FIG. 3 is a plot of input buffer biasing current illustrating changes in biasing current over several processing, temperature and power supply variations in a conventional input buffer as depicted in FIG. 2.
Figure 4:
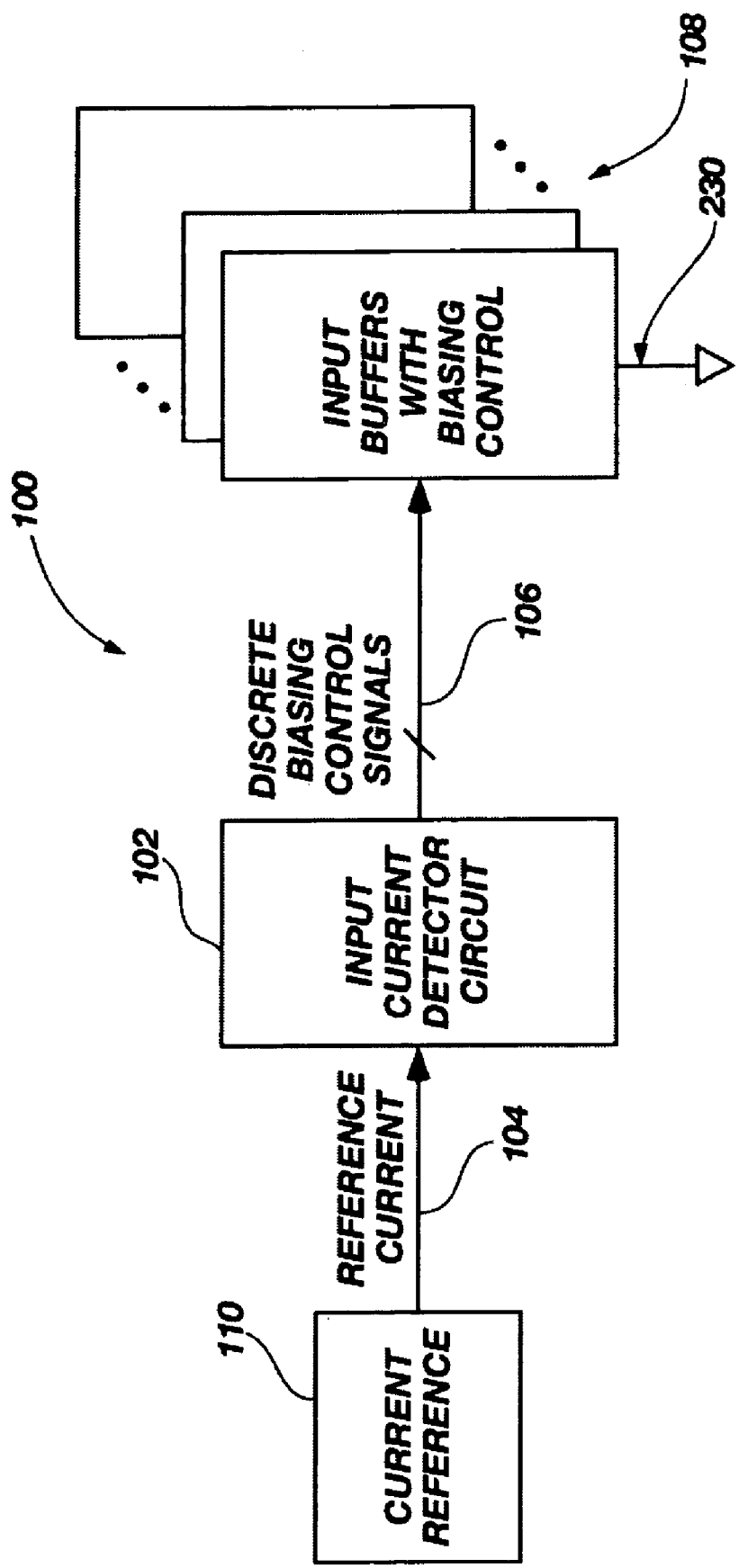
FIG. 4 is a block diagram of an input buffer circuit, in accordance with an embodiment of the present invention.

FIG. 4 illustrates an input buffer circuit, in accordance with an embodiment of the present invention. An input buffer circuit 100 may be incorporated into one or more integrated circuits for providing an input buffer between boards or components that interconnect between various devices. Input buffer circuit 100 includes one or more input buffers 108 which are used to provide an interface between an external device and the internal circuitry located within, for example, an integrated circuit. Input buffers 108, as described with more detail below, include biasing control which adjusts the biasing current of each of the input buffers when variations, such as voltage, temperature and processing changes occur. The biasing control of input buffers 108 are determined by an input current detector circuit 102 which compares a current exhibited under the various variation conditions with a reference current 104 generated by a current reference 110. In response to variations in current as determined by input current detector circuit 102, discrete biasing control signals 106 are generated and the biasing control portion of input buffers 108 are responsive thereto.

Figure 5:
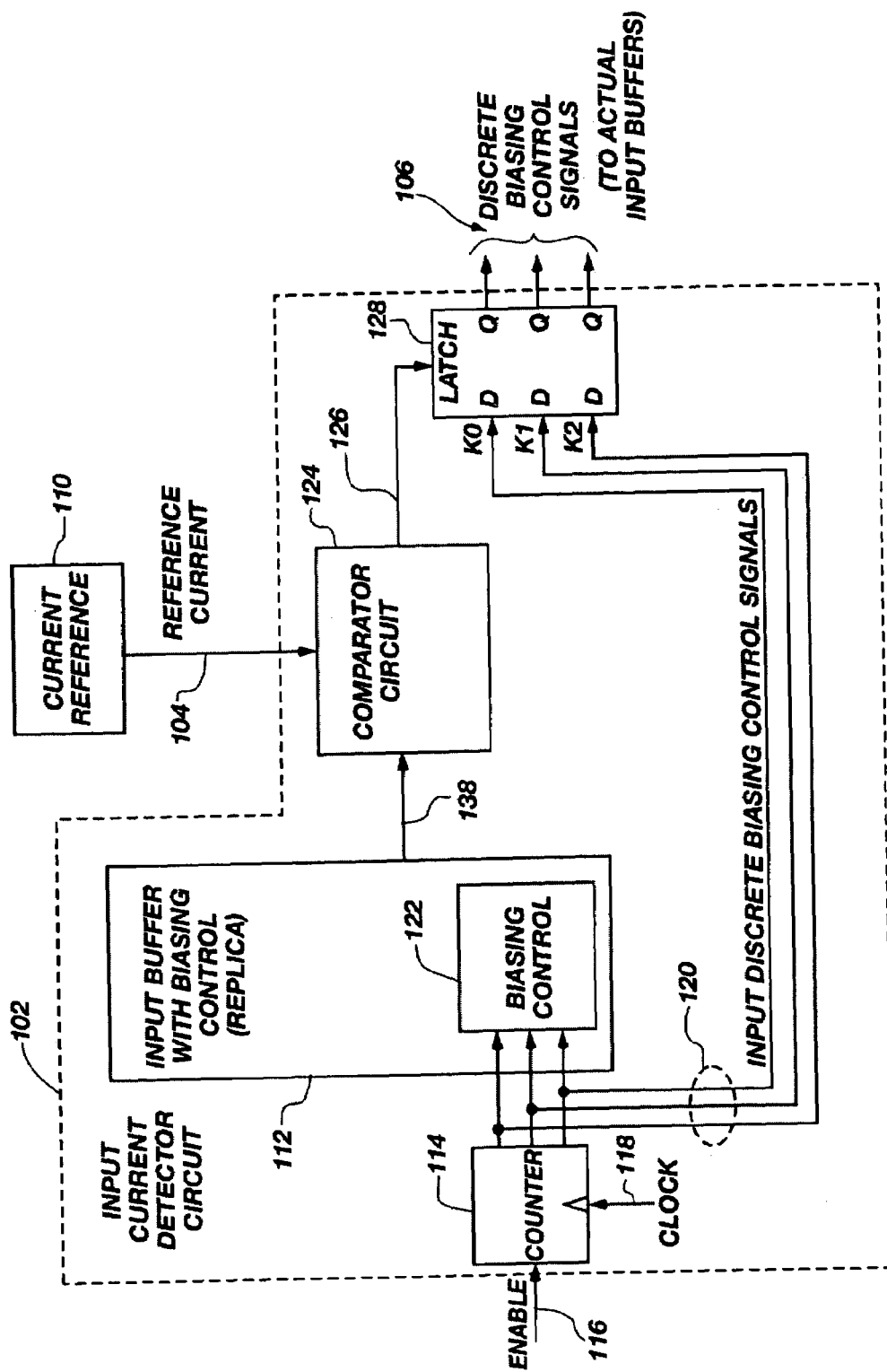
FIG. 5 is a block diagram of an input current detector circuit, in accordance with an embodiment of the present invention.

FIG. 5 illustrates an input current detector circuit 102 included within an input buffer circuit, in accordance with an embodiment of the present invention. Input current detector circuit 102 compares a reference current 104 generated by current reference 110 with an internal current which is generated and affected by the various variations including variations in voltage, temperature and process. The input current detector circuit 102 includes a comparator circuit 124 configured to compare reference current 104 with a representative bias current indicator 138. Current reference 110 may include any of a myriad of reference current generating devices or circuits, an example of which is a bandgap current reference. A bandgap current reference is relatively easily implementable on a semiconductor substrate and results in an acceptable accuracy for the exemplary embodiment.

Figure 6:
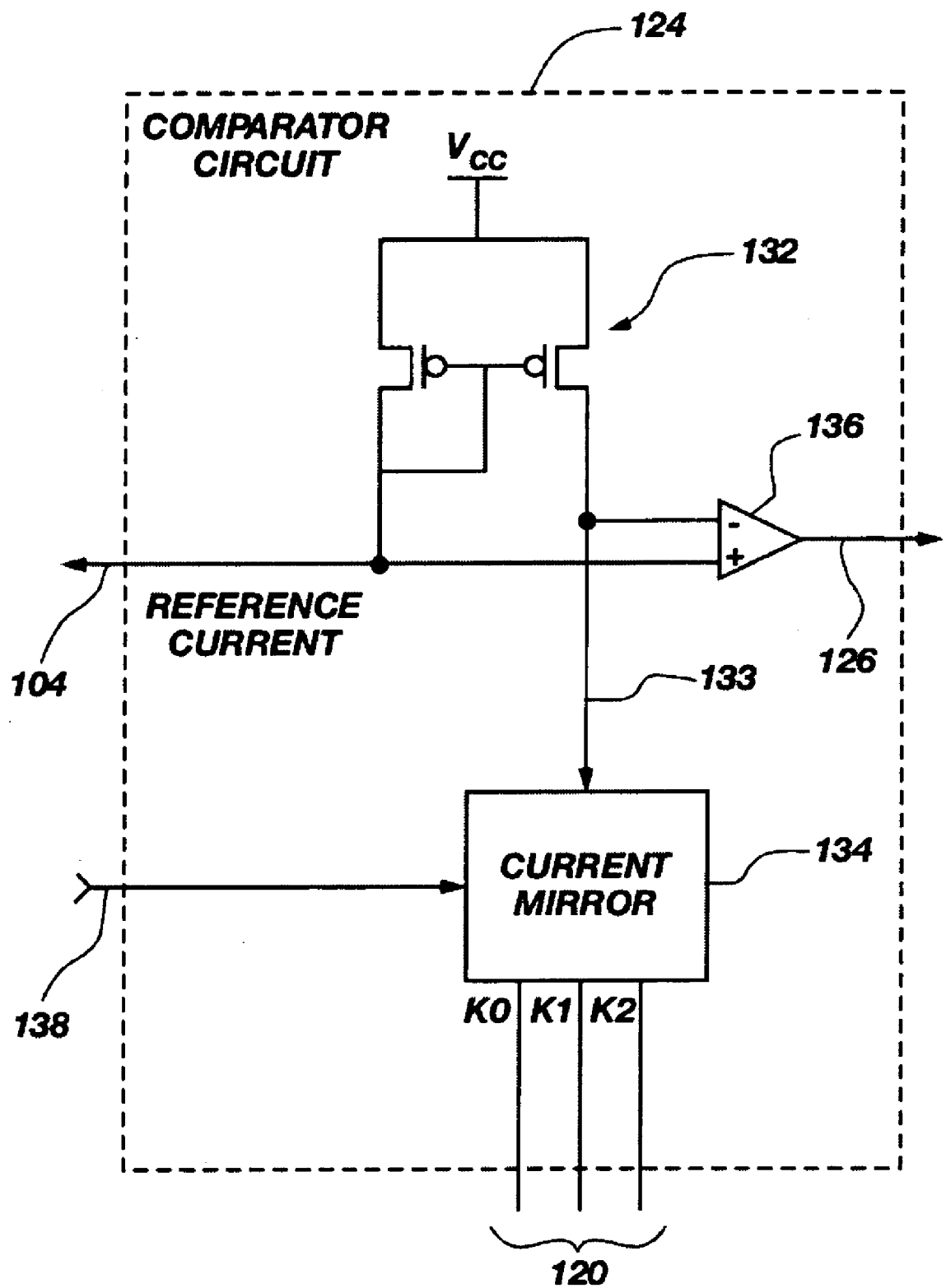
FIG. 6 is a block diagram of a comparator circuit, in accordance with an embodiment of the present invention.

As stated, the input current detector circuit 102 of FIG. 5 further comprises comparator circuit 124. Comparator circuit 124 compares reference current 104 with a representative bias current indicator 138 and generates a latching output signal 126 in response thereto. By way of example and not limitation, comparator circuit 124 is illustrated with respect to one particular embodiment of the present invention and with further reference to FIG. 6. In FIG. 6, comparator circuit 124 includes a coupled transistor pair 132, illustrated in the present embodiment as a current mirror, with each leg coupled to a corresponding current source, namely reference current 104 and an indicator current 133 as generated by a current mirror 134. As previously stated, comparator circuit 124 generates a latching output signal 126 in response to the comparator input signal relationship as determined by a comparator 136.

Figure 7:
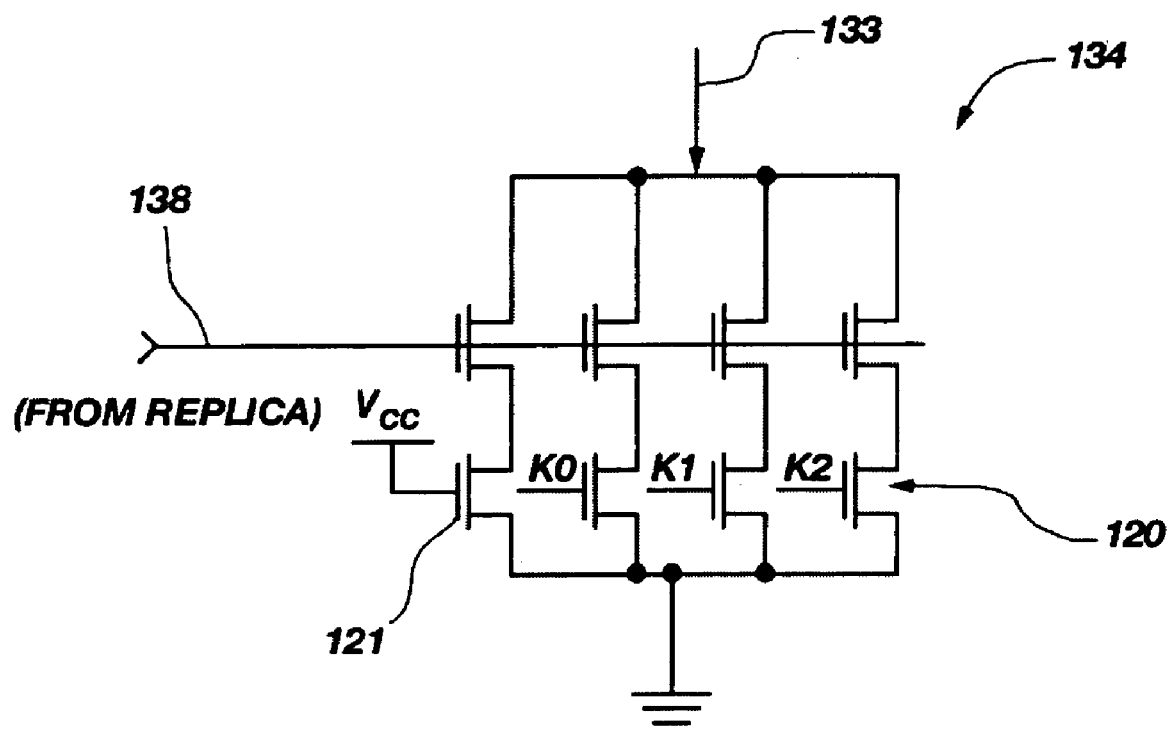
FIG. 7 is a circuit diagram of a current mirror, in accordance with an embodiment of the present invention.

By way of example and not limitation, the current mirror 134 of FIG. 6 is further illustrated with reference to FIG. 7 in accordance with an embodiment of the present invention. Current mirror 134 includes a sequence of digitally controllable pulldown transistors which are each individually selectable according to the interim discrete biasing control signals 120. Additionally, the embodiment as illustrated with reference to FIG. 7 further includes a pulldown transistor 121 that is constantly activated to provide a nominal bias for the current mirror 134.

Returning to FIG. 5, input current detector circuit 102 further includes an input buffer with biasing control implemented as a replica 112, in accordance with an embodiment of the present invention. The input buffer replica 112 is implemented, in accordance with one embodiment of the present invention, as a replica of an input buffer 108 with biasing control of FIG. 4. By implementing a replica of the input buffer within the input current detector circuit 102, the biasing current utilized by a specific input buffer and the variations in voltage, temperature and process subjected thereto may be accurately represented and analyzed for the selection of specific biasing control parameters.

Figure 8:
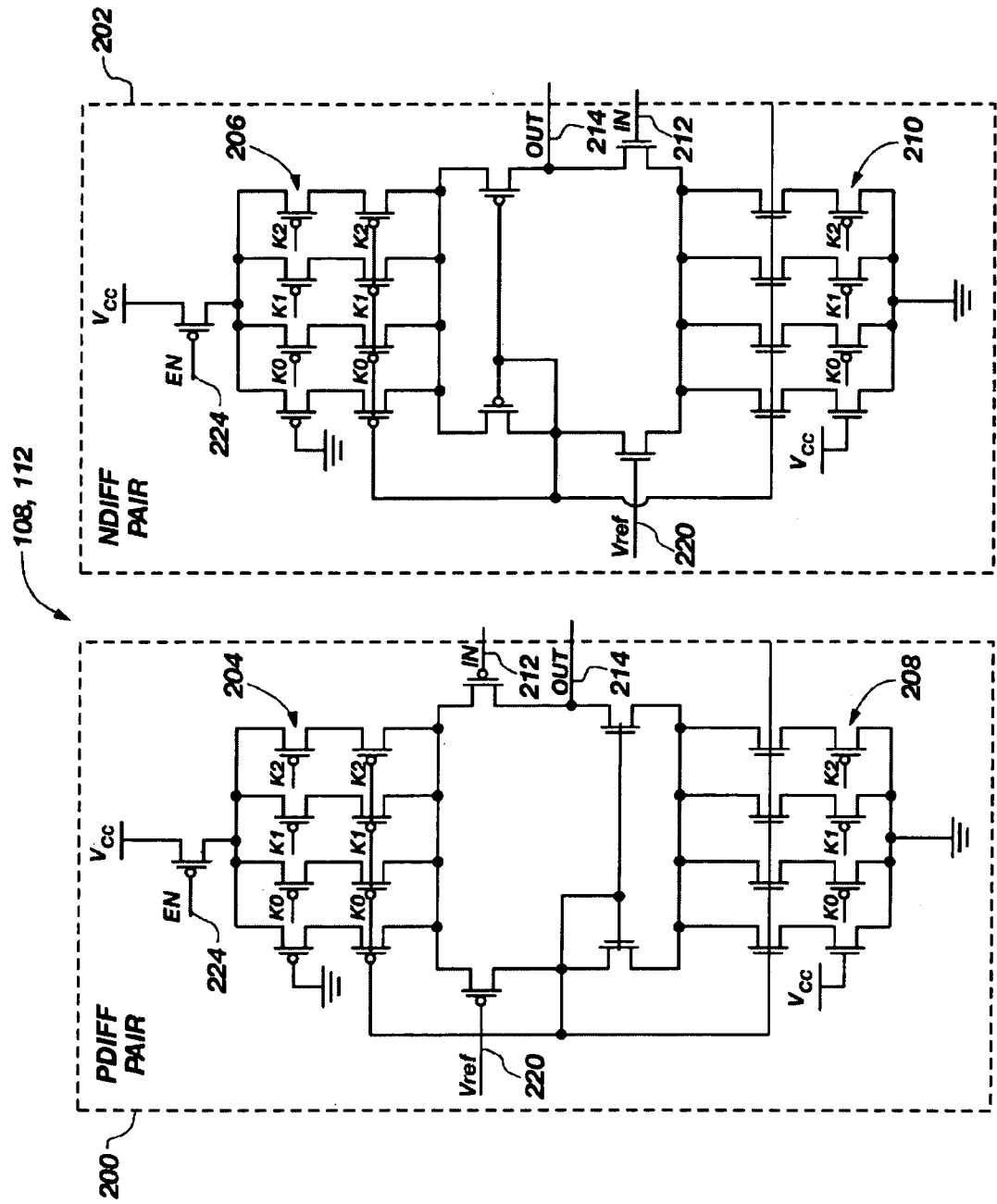
FIG. 8 is a circuit diagram of an input buffer including differential amplifier pairs incorporating self-biasing techniques, in accordance with an embodiment of the present invention.

The input buffer replica 112 of input current detector circuit 102 and the input buffer 108 (FIG. 4) are illustrated in more detail with reference to FIG. 8. Continuing with reference to FIG. 8, the input buffer 108 and input buffer replica 112 are configured, in one embodiment of the present invention, to include balancing circuits configured to generate matching rise and fall times for an output signal generated in response to an input signal received at the input buffer. To provide such matching, complementary pairs are provided, an example of which are illustrated as complementary differential pairs PDIFF pair 200 and NDIFF pair 202. Each DIFF pair 200, 202 includes parallel configurations of selectable pullup and pulldown transistors. Specifically when enabled by enable signal 224, selectable pullup transistors 204, 206 selectably pull up the differentially configured input signal 212 and reference signal 220. The selectable pullup transistors 204, 206 may include one or more pullup transistors arranged in parallel. By way of example, and not limitation, selectable pullup transistors 204, 206 are illustrated to include one or more selectable pullup transistors which, in the present example, include three individual transistors selectable by control signals K0, K1 and K2 with a constantly activated pullup transistor that provides a nominal bias current.

Similarly, differential pairs 200, 202 include selectable pulldown transistors 208, 210 which are similarly configured and controllable. Specifically when enabled by enable signal 224, selectable pulldown transistors 208, 210 selectably pull down the differentially configured input signal 212 and reference signal 220. The selectable pulldown transistors 208, 210 may include one or more pulldown transistors arranged in parallel. By way of example, and not limitation, selectable pulldown transistors 208, 210 are illustrated to include one or more selectable pulldown transistors which, in the present example, include three individual transistors selectable by control signals K0, K1 and K2 with a constantly activated pulldown transistor that provides a nominal bias current. The differential pairs 200, 202 include output signal 214.

Returning to FIG. 5, input current detector circuit 102 generates the discrete biasing control signals 106 which are latched according to a latch 128. Discrete biasing control signals 106 control a biasing control portion 122 of input buffer replica 112 which generally include selectable pullup transistors 204, 206 and selectable pulldown transistors 208, 210, as previously described with reference to FIG. 8. Discrete biasing control signals 106 result from latched interim discrete biasing control signals 120 which are generated by counter 114 under the control of enable signal 116 and clock signal 118. Interim discrete biasing control signals 120 are generated by counter 114 and function as the biasing control signals for the replica input buffer replica 112.

Figure 9:
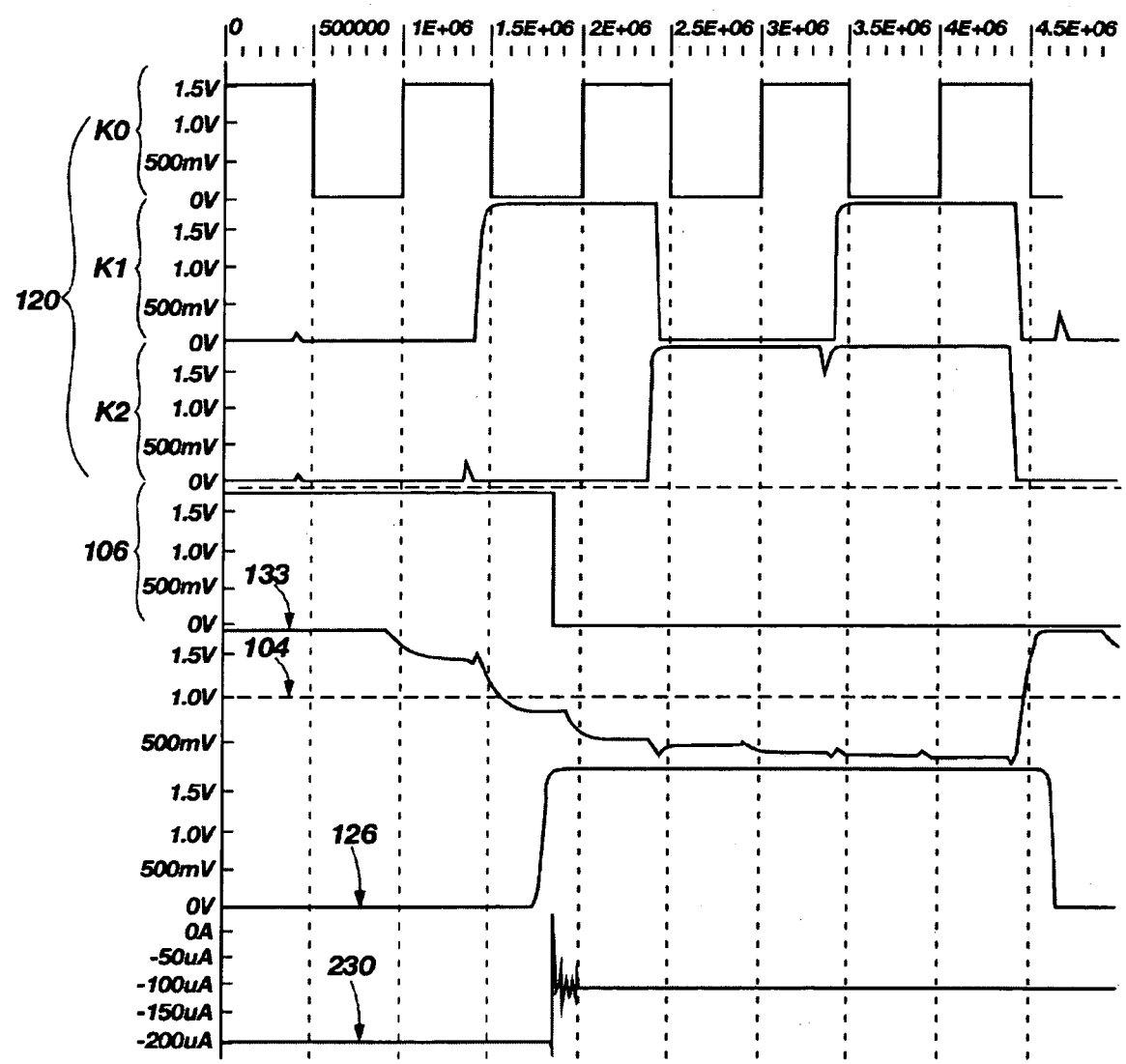
FIG. 9 is a plot diagram of signal waveforms of a self-biasing input buffer circuit, in accordance with an embodiment of the present invention.

The operation of biasing selection with respect to the embodiment of FIG. 5 is described in conjunction with the timing diagram of FIG. 9. While an input buffer could be configured according to the present invention to provide continuous updates of the discrete biasing control signals 106, the present embodiment provides periodic updates to the discrete biasing control signals 106. Specifically, clock signal 118 provides a continuous clock signal to counter 114. In the present embodiment, counter 114 is implemented as an up-counter that increments once per clock cycle when enabled. The enable signal 116 is configured to be active for the full counting range of counter 114. When enable signal 116 is active, clock signal 118 begins incrementing the count of counter 114. For each count of counter 114, interim discrete biasing control signals 120 are input into biasing control portion 122 of input buffer replica 112. The input buffer replica 112 generates a representative bias current indicator 138 that results from the corresponding counter count (i.e., values of, for example, K0–K2) and the condition variations (e.g., process variations, supply voltage variations, temperature variations) about the input buffer replica 112. The larger counter value will generate larger biasing current. Once the circuit is enabled, the up-counter output k2, k1, k0 changes from 000, 001, . . . 111 as shown in FIG. 9. Thus, the biasing current of the input buffer replica 112 is also increased accordingly. The representative bias current indicator 138 is then compared at comparator circuit 124 to reference current 104. The latching output signal 126 remains at a steady state until a crossover of the comparator occurs.

In continuing the update process, counter 114 then increments the count again with a similar generation of latching output signal 126. If, for example, the comparative relationship changes with respect to representative bias current indicator 138 and reference current 104, then latching output signal 126 changes state resulting in the clocking of latch 128 causing latch 128 to output the interim discrete biasing control signals 120 as the discrete biasing control signals 106 which are used by the input buffers 108 (FIG. 4). Discrete biasing control signals 106 are then output to the input buffers 108 with the biasing current 230 (FIG. 4 and FIG. 9) of the input buffers being varied according to the presence of variations. The enable signal 116 is then periodically asserted causing the reevaluation of the variations and the selection of discrete biasing control signals 106 according to the currently present variations.

Figure 10:
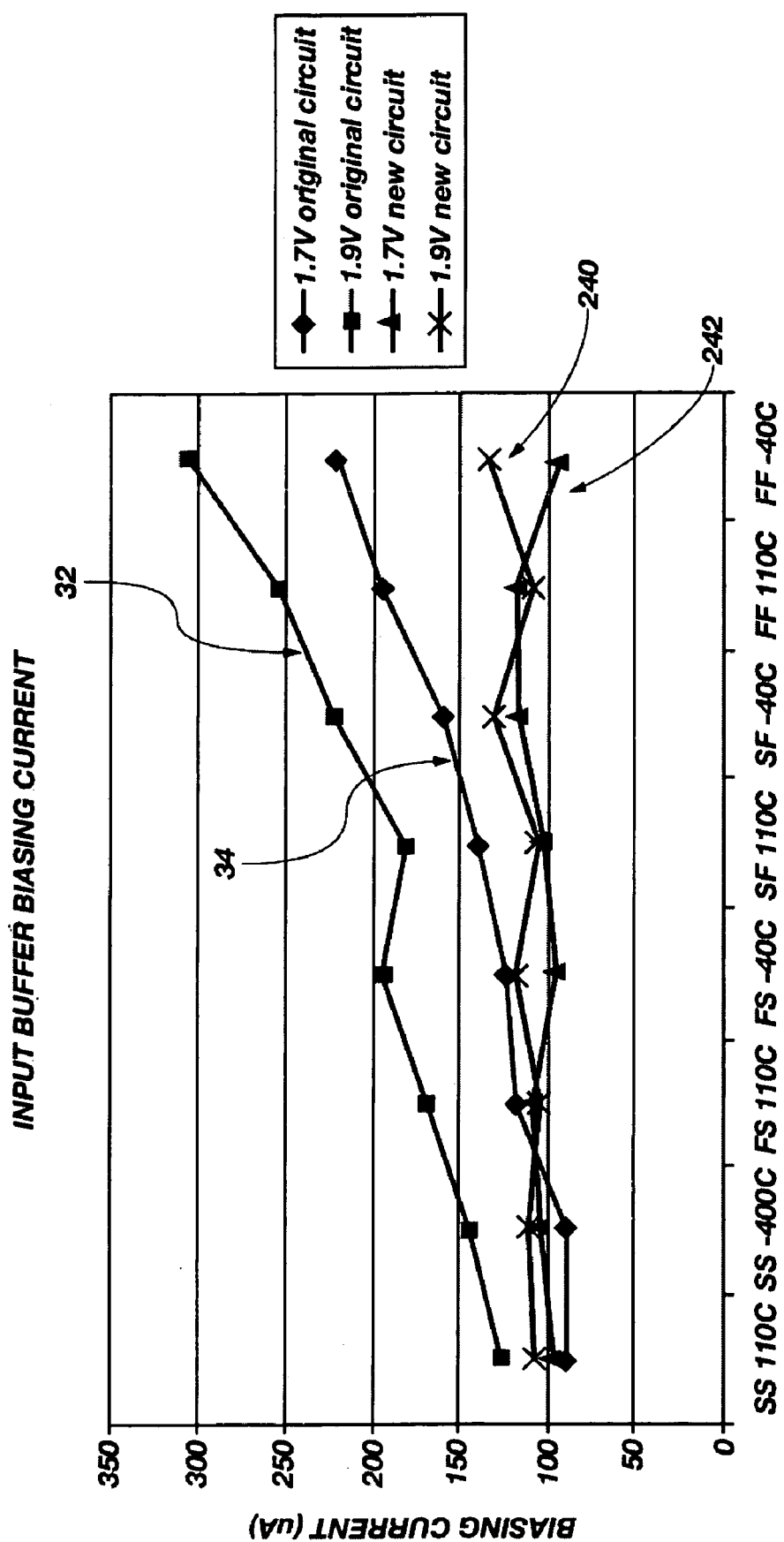
FIG. 10 is a plot diagram of input buffer biasing current contrasting an exemplary plot of biasing current of an input buffer both before and after incorporating the self-biasing techniques in accordance with an embodiment of the present invention.

FIG. 10 is a diagram plotting performance plots over variations, in accordance with an embodiment of the present invention. Plots 32 and 34 represent the variations to input bias current for an input buffer without the biasing techniques described herein. FIG. 10 further illustrates a reduction in variations over the spectrum of variations (e.g., process, supply voltage and temperature). Plots 240 and 242 illustrate a significant reduction in variations to biasing current over the variations described herein when an input buffer includes the biasing techniques according to one or more embodiments of the present invention described herein. In accordance with the specific example as illustrated herein, a reduction in the input biasing current over process, supply voltage and temperature changes may reduce variations to input biasing current from approximately 300% to ±20%.

Figure 11:
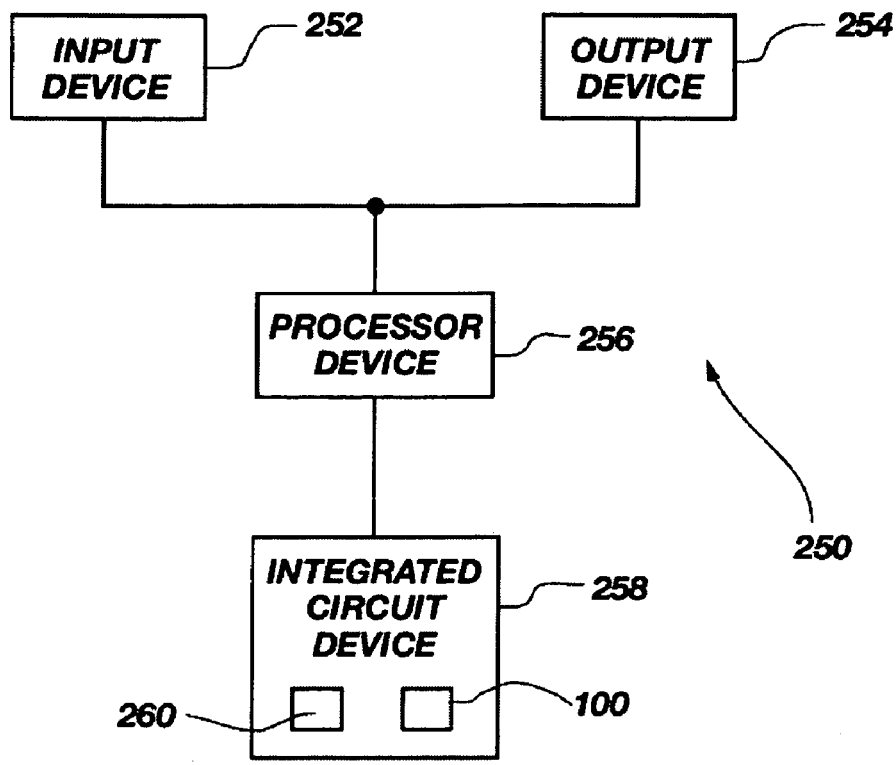
FIG. 11 is a block diagram of an electronic system including an input buffer circuit, in accordance with an embodiment of the present invention.
Figure 12:
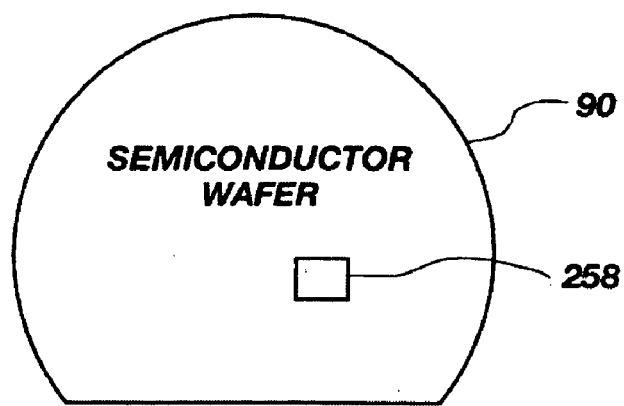
FIG. 12 illustrates a semiconductor wafer incorporating an input buffer circuit, in accordance with an embodiment of the present invention.

As shown in FIG. 11, an electronic system 250 includes an input device 252, an output device 254, a processor device 256, and an integrated circuit device 258 that incorporates an integrated circuit 260 for performing an electrical function, and example of which is a memory storage and retrieval function. The integrated circuit device 258 further includes the input buffer circuit 100 as described herein. Additionally, any one of the devices 252, 254 and 256 may include one or more input buffer circuits 100. FIG. 12 illustrates a semiconductor wafer 90 including one or more integrated circuit devices 258 fabricated on the surface thereof.

Although the present invention has been described with reference to particular embodiments, the invention is not limited to these described embodiments. Rather, the invention is limited only by the appended claims, which include within their scope all equivalent devices or methods that operate according to the principles of the inventions as described.

What is claimed is:

1. An input buffer circuit, comprising:
   an input current detector circuit configured to generate a plurality of discrete biasing control signals; and
   at least one input buffer configured to adjust a biasing current in response to the plurality of discrete biasing control signals, the plurality of discrete biasing control signals generated by the input current detector circuit in response to variations in biasing current as determined by comparison of a reference current with a representative bias current indicator as determined from a replica of the at least one input buffer within the input current detector circuit.

2. The input buffer circuit of claim 1, further comprising a current reference configured to generate the reference current for use in determining the variations in the biasing current.

3. The input buffer circuit of claim 2, wherein the current reference is a bandgap current reference configured to generate the reference current.

4. The input buffer circuit of claim 1, further comprising a comparator circuit configured to compare the representative bias current indicator with the reference current to determine the variations in the biasing current of the at least one input buffer.

5. The input buffer circuit of claim 4, further comprising a counter circuit coupled to the replica of one of the at least one input buffer, the counter circuit configured to generate interim discrete biasing control signals to adjust biasing within the replica of one of the at least one input buffer.

6. The input buffer circuit of claim 5, further comprising a latch configured to latch the interim discrete biasing control signals as the plurality of discrete biasing control signals in response to comparison of the representative bias current indicator with the reference current.

7. An integrated circuit device, comprising:
   an integrated circuit; and
   at least one input buffer circuit operably coupled to the integrated circuit, including:
      an input current detector circuit configured to generate a plurality of discrete biasing control signals; and
      at least one input buffer configured to adjust a biasing current in response to the plurality of discrete biasing control signals, the plurality of discrete biasing control signals generated by the input current detector circuit in response to variations in biasing current as determined by comparison of a reference current with a representative bias current indicator as determined from a replica of the at least one input buffer within the input current detector circuit.

8. The integrated circuit device of claim 7, wherein the integrated circuit is a memory array configured to receive an input signal through the at least one input buffer circuit.

9. The integrated circuit device of claim 7, further comprising a current reference configured to generate the reference current for use in determining the variations in the biasing current.

10. The integrated circuit device of claim 9, wherein the current reference is a bandgap current reference configured to generate the reference current.

11. The integrated circuit device of claim 7, further comprising a comparator circuit configured to compare the representative bias current indicator with the reference current to determine the variations to the biasing current of the at least one input buffer.

12. The integrated circuit device of claim 11, further comprising a counter circuit coupled to the replica of one of the at least one input buffer, the counter circuit configured to generate interim discrete biasing control signals to adjust biasing within the replica of one of the at least one input buffer.

13. The integrated circuit device of claim 12, further comprising a latch configured to latch the interim discrete biasing control signals as the plurality of discrete biasing control signals in response to comparison of the representative bias current indicator with the reference current.

14. An electronic system comprising an input device, an output device, an integrated circuit device and a processor device coupled to the input, output, and memory devices, at least one of the devices including an input buffer circuit, comprising:
   an input current detector circuit configured to generate a plurality of discrete biasing control signals; and
   at least one input buffer configured to adjust a biasing current in response to the plurality of discrete biasing control signals, the plurality of discrete biasing control signals generated by the input current detector circuit in response to variations in biasing current as determined by comparison of a reference current with a representative bias current indicator as determined from a replica of the at least one input buffer within the input current detector circuit.

15. The electronic system circuit of claim 14, further comprising a current reference configured to generate the reference current for use in determining the variations in the biasing current.

16. The electronic system of claim 15, wherein the current reference is a bandgap current reference configured to generate the reference current.

17. The electronic system of claim 14, further comprising a comparator circuit configured to compare the representative bias current indicator with the reference current to determine the variations to the biasing current of the at least one input buffer.

18. The electronic system of claim 17, further comprising a counter circuit coupled to the replica of one of the at least one input buffer, the counter circuit configured to generate interim discrete biasing control signals to adjust biasing within the replica of one of the at least one input buffer.

19. The electronic system of claim 18, further comprising a latch configured to latch the interim discrete biasing control signals as the plurality of discrete biasing control signals in response to comparison of the representative bias current indicator with the reference current.

20. A semiconductor wafer comprising an integrated circuit device fabricated on its surface, the integrated circuit device comprising:
   an integrated circuit; and
   at least one input buffer circuit coupled to the integrated circuit, including:
      an input current detector circuit configured to generate a plurality of discrete biasing control signals; and
      at least one input buffer configured to adjust a biasing current in response to the plurality of discrete biasing control signals, the plurality of discrete biasing control signals generated by the input current detector circuit in response to variations in biasing current as determined by comparison of a reference current with a representative bias current indicator as determined from a replica of the at least one input buffer within the input current detector circuit.

21. The semiconductor wafer of claim 20, wherein the integrated circuit is a memory array configured to receive an input signal through the at least one input buffer circuit.

22. The semiconductor wafer of claim 20, further comprising a current reference configured to generate the reference current for use in determining the variations in the biasing current.

23. The semiconductor wafer of claim 22, wherein the current reference is a bandgap current reference configured to generate the reference current.

24. The semiconductor wafer of claim 20, further comprising a comparator circuit configured to compare the representative bias current indicator with the reference current to determine the variations to the biasing current of the at least one input buffer.

25. The semiconductor wafer of claim 24, further comprising a counter circuit coupled to the replica of one of the at least one input buffer, the counter circuit configured to generate interim discrete biasing control signals to adjust biasing within the replica of one of the at least one input buffer.

26. The semiconductor wafer of claim 25, further comprising a latch configured to latch the interim discrete biasing control signals as the plurality of discrete biasing control signals in response to comparison of the representative bias current indicator with the reference current.

27. A method for altering biasing current in an input buffer circuit, comprising:
  comparing a representative bias current indicator from a replica of an input buffer with a reference current to determine variations in biasing current of at least one input buffer;
  generating a plurality of discrete biasing control signals indicating a configuration of a biasing control for the at least one input buffer; and
  biasing the at least one input buffer according to the plurality of discrete biasing control signals.

28. The method of claim 27, further comprising iteratively changing the representative bias current indicator prior to comparing the representative bias current indicator with the reference current.

29. The method of claim 27, further comprising periodically repeating the comparing, generating and biasing acts.

30. The method of claim 29, further comprising latching the plurality of discrete biasing control signals until a subsequent iteration of the periodically repeating of the comparing and generating acts.

* * * * *